United States Patent [19]

Yamakawa et al.

[11] Patent Number: 5,085,923
[45] Date of Patent: Feb. 4, 1992

[54] HEAT-CONDUCTIVE ALUMINUM NITRIDE SINTERED BODY AND METHOD OF MANUFACTURING THE SAME

[75] Inventors: Akira Yamakawa; Masaya Miyake; Hitoyuki Sakanoue; Hisao Takeuchi; Koichi Sogabe; Akira Sasame, all of Hyogo, Japan

[73] Assignee: Sumitomo Electric Industries, Ltd., Osaka, Japan

[21] Appl. No.: 686,658

[22] Filed: Apr. 17, 1991

Related U.S. Application Data

[62] Division of Ser. No. 303,284, Jan. 26, 1989, Pat. No. 5,034,357.

[30] Foreign Application Priority Data

Feb. 8, 1988 [JP] Japan ................................. 63-28270

[51] Int. Cl.⁵ .............................................. B32B 18/00
[52] U.S. Cl. ..................................... 428/209; 428/698; 428/901; 501/97; 501/98
[58] Field of Search .............. 428/688, 698, 209, 901; 501/96, 97, 98; 264/61

[56] References Cited

U.S. PATENT DOCUMENTS

| | | | |
|---|---|---|---|
| 4,578,232 | 3/1986 | Hoseby et al. | 264/65 |
| 4,770,953 | 9/1988 | Horiguchi et al. | 428/698 |
| 4,847,221 | 7/1989 | Horiguchi et al. | |
| 4,897,372 | 1/1990 | Hoseby et al. | 501/96 |
| 4,906,511 | 3/1991 | Sato et al. | 428/192 |
| 4,961,987 | 10/1990 | Okono et al. | 428/209 |

FOREIGN PATENT DOCUMENTS

| | | |
|---|---|---|
| 3627317 | 2/1987 | Fed. Rep. of Germany . |
| 71575 | 4/1985 | Japan . |
| 71576 | 4/1985 | Japan . |
| 96578 | 5/1985 | Japan . |
| 127267 | 7/1985 | Japan . |
| 155263 | 7/1986 | Japan . |
| 41766 | 2/1987 | Japan . |

OTHER PUBLICATIONS

Article entitled: "High Thermal Conductive AlN Ceramics by Pressureless Sintering in Reducing Atmosphere" (III)-Investigation of Additives—by Akihiro Horiguchi et al. (Toshiba R&D Center), pp. 967 & 970 of 'Proceeding for 1987 Yogyo Kyokai's Annual Meeting'.
Article entitled "Aluminum Nitride Substrates Having High Thermal Conductivity" by Iwase et al.: Solid State Technology/Oct. 1986; No. 10, Port Washington, N.Y., U.S.A.; pp. 135–138.

Primary Examiner—Mark L. Bell
Assistant Examiner—Alan Wright
Attorney, Agent, or Firm—W. G. Fasse; D. H. Kane, Jr.

[57] ABSTRACT

An aluminum nitride sintered body is mainly composed of aluminum nitride, contains 0.01 to 1.0 percent by weight of a rare earth element and 0.001 to 0.5 percent by weight of oxygen, and has thermal conductivity of at least 180 W/mK. According to a method of manufacturing such an aluminum nitride sintered body, aluminum nitride powder (201) is first prepared. At least one compound (203) containing a rare earth element is added to the aluminum nitride powder (201) to contain 0.01 to 1.0 percent by weight, in rare earth element conversion, of the compound, to be homogeneously mixed with each other. A formed body obtained by forming such mixed powder is sintered in a non-oxidizing atmosphere containing nitrogen at a temperature of 1500 to 2200° C.

6 Claims, 4 Drawing Sheets

A : Y₂O₃ : 0.6wt%, C : 0.7wt%
B : Y₂O₃ : 0.3wt%, C : 0.7wt%
C : PRESENT INVENTION

5μm

A : Y2O3 : 0.6wt%, C : 0.7wt%
B : Y2O3 : 0.3wt%, C : 0.7wt%
C : PRESENT INVENTION

HEAT-CONDUCTIVE ALUMINUM NITRIDE SINTERED BODY AND METHOD OF MANUFACTURING THE SAME

This is a divisional of application Ser. No. 07/303,248 filed: Jan. 26, 1989, now U.S. Pat. No. 5,034,357.

BACKGROUND OF THE INVENTION

1. Field of the Invention

The present invention relates to a heat-conductive aluminum nitride sintered body and a method of manufacturing the same, and more particularly, it relates to a dense heat-conductive aluminum nitride sintered body which has excellent characteristics such as heat conductivity, insulability and permittivity, and a method of manufacturing the same.

2. Description of the Background Art

Technique relating to a large scale integrated circuit (LSI) has been remarkably advanced in recent years, particularly with improvement in circuit density. Increase in chip size of a semiconductor integrated circuit (IC) also contributes to such improvement in circuit density, and calorific power of a package for carrying an IC chip is increased with such increase in IC chip size. Thus, importance has been attached to heat radiation of a material for an insulator substrate, which is applied to a package for a semiconductor device or the like. Such an insulator substrate is generally prepared from alumina ($Al_2O_3$). However, with small thermal conductivity of 30 W/mK, alumina is inferior in heat dissipation in contrast to excellence in electrical insulability and mechanical strength, and hence it is inadequate to carry a field-effect transistor (FET) of high calorific power or the like on an alumina substrate. Although there is an insulator substrate which is prepared from beryllia (BeO) having high thermal conductivity for carrying a semiconductor element of high calorific power, safety measures for using such a substrate are complicated since beryllia is toxic.

With respect to such an insulator substrate for carrying a semiconductor element of high calorific power, therefore, heat-conductive aluminum nitride (AlN), which is intoxic and equivalent in electrical insulability and mechanical strength to alumina, has been recently watched as an effective insulating material for a semiconductor device or a package.

As hereinabove described, aluminum nitride theoretically has high thermal conductivity and insulability as a monocrystal material. However, since powder of aluminum nitride itself is inferior in degree of sintering, relative density of a sintered body prepared by forming such aluminum nitride powder and sintering the same is about 70 to 80% at the most with reference theoretical density of aluminum nitride of 3.26 g/cm$^3$, depending on sintering conditions, while the sintered body contains a large amount of pores. Therefore, it is independently employing aluminum nitride powder.

In an insulating ceramics member such as an aluminum nitride sintered body, thermal conduction is performed mainly through phonon conduction. Thus, phonon scattering is caused by defects such as pores, impurities etc. contained in the sintered body, to reduce the level of its thermal conductivity. In order to obtain an aluminum nitride sintered body having high thermal conductivity, various proposals have been made as follows:

(1) Japanese Patent Laying-Open Gazette No. 96578/1985, for example, discloses a method of adding $Y_2O_3$, serving as a sintering assistant and a deoxidizer, to aluminum nitride powder and sintering the same.

(2) Each of Japanese Patent Laying-Open Gazettes Nos. 71576/1985 and 155263/1986, for example, discloses a method of adding carbon to aluminum nitride powder and sintering the same for deoxidation, thereby to obtain a sintered body having a small content of oxygen.

(3) Each of Japanese Patent Laying-Open Gazette Nos. 71575/1985 and 127267/1985, for example, discloses a method of employing high purity aluminum nitride powder having a small content of oxygen.

(4) Japanese Patent Laying-Open Gazette No. 41766/1987, for example, discloses a method of decomposing/evaporating a sintering assistant remaining in a sintered body, to obtain an aluminum nitride sintered body of high purity.

(5) Proceeding for 1987 Yogyo Kyokai's Annual Meeting p. 969, for example, discloses a method of removing a sintering assistant remaining in a sintered body by exposing the same to a reducing atmosphere for a long time.

In the method (1) of adding $Y_2O_3$ and performing ball-mill mixing, it is necessary to add at least 1 percent by weight of $Y_2O_3$ in order to obtain a dense heat-conductive sintered body. However, thermal conductivity of a sintered body thus obtained is about 200 W/mK at the most, and dispersion thereof is significant. If a large amount of $Y_2O_3$ is added, thick intergranular phases are formed around aluminum nitride particles, to reduce oxidation resistance of the sintered body while increasing permittivity.

The method (2) is directed to reduce the amount of oxygen contained in aluminum nitride through a deoxidizing action of carbon. However, when no sintering assistant is added, the sintered body has low thermal conductivity of about 80 W/mK since it is difficult to densify the sintered body having low density, as disclosed in Japanese Patent Laying-Open Gazette No. 71576/1985. If $Y_2O_3$ is to be added as a sintering assistant as disclosed in Japanese Patent Laying-Open Gazette No. 155263/1986, it is necessary to add at least 1 percent by weight of $Y_2O_3$ in order to densify the sintered body.

According to Japanese Patent Laying-Open Gazette No. 71575/1985 listed in the item (3), the amount of oxygen contained in the sintered body is at least 0.5 percent by weight while the sintered body has low thermal conductivity of about 40 W/mK, even if aluminum nitride powder of high purity is employed as a raw material. As shown in Japanese Patent Laying-Open Gazette No. 127267/1985, further, thermal conductivity of a sintered body obtained by adding at least 3 percent by weight of $Y_2O_3$ is about 70 W/mK.

As hereinabove described, an aluminum nitride sintered body obtained by adding a small amount of sintering assistant has low thermal conductivity in the existing circumstances.

According to the method (4) or (5) of adding a large amount of sintering assistant, sintering the material and thereafter removing the sintering assistant, on the other hand, it is assumed that an aluminum nitride sintered body thus obtained has high thermal conductivity exceeding 200 W/mK with improvement in permittivity etc. However, according to a method of removing the sintering assistant by adding a fluoride, a sintering furnace is inevitably contaminated and dispersion in characteristic of a sintered body thus obtained is increased not only in a lot but in the same sintered body, as shown in Japanese Patent Laying-Open Gazette No. 41766/1987. Further, the face of the sintered body is so roughened that after-treatment is inevitably required for employment, because of irregularity caused by evaporation/volatilization of the sintering assistant. According to the method of sintering the material in a reducing atmosphere for a long time as disclosed in Proceeding for 1987 Yogyo Kyokai's Annual Meeting, the cost required for such sintering is extremely increased while the sintering assistant segregates in the sintered face of the sintered body. Thus, the sintered body cannot be directly employed with such a sintered face, while the same has large dispersion in characteristic.

SUMMARY OF THE INVENTION

An object of the present invention is to solve the aforementioned various technical problems of the prior art, and to provide a heat-conductive aluminum nitride sintered body which has high purity, high density and high thermal conductivity, and a method of manufacturing the same.

As the result of various studies, the present invention provides aluminum nitride ceramics of high density having thermal conductivity of at least 180 W/mK and containing an extremely small amount of sintering assistant in grain boundaries of aluminum nitride. The inventors have found that, upon homogeneous distribution of aluminum nitride intergranular phases, recrystallization of aluminum nitride so progresses as to attain high density and high thermal conductivity while reducing the amount of oxygen, which is contained in the sintered body as an impurity, to be not more than 0.5 percent by weight, due to presence of a substance reducing surface free energy of aluminum nitride particles.

A heat-conductive aluminum nitride sintered body according to the present invention is mainly composed of aluminum nitride, contains 0.01 to 1.0 percent by weight of a rare earth element and 0.01 to 0.5 percent by weight of oxygen, and has thermal conductivity of at least 180 W/mK. Examples of rare earth elements are scandium, yttrium and lanthanoid series elements such as lanthanum, cerium, praseodymium, neodymium, promethium, samarium, europium, gadolinium, terbium, dysoprosium, holmium, erbium, thulium, ytterbium and lutetium.

If the content of the rare earth element is not more than 0.01 percent by weight, it is difficult to densify the sintered body while the content of oxygen is increased to reduce thermal conductivity. If the content of the rare earth element exceeds 1.0 percent by weight, permittivity is increased and oxidation resistance is reduced although the sintered body has thermal conductivity of about 200 W/mK.

The general assumption that a dense sintered body can be obtained with a content of a rare earth element of at least 1 percent by weight is considered to be because a rare earth element has been generally added/mixed in the form of an oxide, a hydroxide or the like to be insufficiently mixed with aluminum nitride powder. In other words, it may be considered that a dense sintered body having high thermal conductivity can be obtained according to the present invention by adding/mixing dense particles containing a rare earth element in the form of a compound such as stearic acid, even if the amount of the rare earth element, serving as a sintering assistant, is not more than 1 percent by weight.

FIGS. 2A and 2B are typical diagrams showing finely mixed states of aluminum nitride particles 201 and sintering assistant particles 203. FIG. 2A shows such a conventional mixed state that relatively large sintering assistant particles 203 are left between the aluminum nitride particles 201, as the result of insufficient mixing of the aluminum nitride particles 201 and the sintering assistant particles 203. On the other hand, FIG. 2B shows such a mixed state according to the present invention that fine sintering assistant particles 203 are adhered to the surfaces of the aluminum nitride particles 201 to achieve homogeneous mixing.

The amount of oxygen contained in a sintered body exerts significant influence on thermal conductivity of the sintered body. Therefore, the amount of oxygen contained in the inventive aluminum nitride sintered body is limited in a range of 0.001 to 0.5 percent by weight. If the content of oxygen exceeds 0.5 percent by weight, thermal conductivity of at least 180 W/mK cannot be obtained. If the content of oxygen is not more than 0.001 percent by weight, on the other hand, density of the sintered body is instabilized. Further, the manufacturing cost is extremely increased to obtain an oxygen content of not more than 0.001 percent by weight.

The average particle size of aluminum nitride particles forming the inventive aluminum nitride sintered body is preferably at least 5 $\mu$m. Following particle growth of the aluminum nitride particles, defects such as pores, oxygen etc. contained therein are discharged from intergranular parts, thereby to improve thermal conductivity of the aluminum nitride sintered body. In other words, insufficient particle growth of aluminum nitride particles leads to low thermal conductivity of the sintered body.

The inventive aluminum nitride sintered body contains an extremely small amount of intergranular phases. The intergranular phases are present in such a small amount that it is hard to detect the same by X-ray diffraction, in thickness of not more than 1 $\mu$m. The intergranular phases are bad thermal conductors, which are assumed to reduce thermal conductivity of aluminum nitride. Therefore, the amount of such interqranular phases is preferably reduced to the minimum, so far as the degree of sintering is not lowered. An aluminum nitride sintered body having high thermal conductivity can be obtained if intergranular phases, which are substantially not more than 1 $\mu$m in thickness, are scattered in grain boundaries.

The intergranular phases, containing a rare earth element, aluminum, oxygen and nitrogen, are present in a ratio of not more than 0.9 percent by volume in the sintered body. The intergranular phases are in composition of a high-temperature molten solution obtained by reaction of the rare earth element added as a sintering assistant with aluminum and oxygen present in the surfaces and interiors of aluminum nitride particles, which molten solution solution-treats nitrogen. The rare earth element added as a sintering assistant serves to deoxidize aluminum nitride. The amount of the intergranular phases contained in the sintered body is preferably not more than 0.9 percent by volume. If the amount of intergranular phases exceeds 0.9 percent by volume, thermal conductivity of the sintered body is reduced. The content of the intergranular phases is varied with the amount of addition of the rare earth element, the amount of oxygen contained in the raw material of aluminum nitride powder as an impurity, sintering conditions and the like, while a heat-conductive sintered body can be obtained if the said content is not more than 0.9 percent by volume. The amount of the rare earth element contained in the sintered body is substantially equivalent to the amount of that added to mixed powder serving as a raw material. Thus, the amount of reduction of the rare earth element is extremely small. The inventive aluminum nitride sintered body contains carbon. The content of carbon is at least 0.001 percent and not more than 0.1 percent by weight. The ratio of the content of carbon to that of the rare earth element is within a range of 1/100 to 1/10. If the content of carbon exceeds 0.1 percent by weight, the sintered body is reduced in density as well as in thermal conductivity, and its dielectric voltage resistance is extremely reduced. Although the effect of existence of carbon is not yet clarified in mechanism, it may be considered that a small amount of carbon acts on reduction of aluminum nitride, to reduce the content of oxygen.

According to the inventive sintered body, no significant change is caused in distribution of the rare earth element in the sintered body. According to the conventional method of adding a large amount of sintering assistant to densify the material and thereafter removing the sintering assistant during sintering, the sintering assistant segregates on the surface of the sintered body, such that most part thereof is changed into a nitride. Thus, it is impossible to directly use the sintered body having the sintered face of this state. According to the present invention, on the other hand, no large segregation of the rare earth element is caused during sintering, whereby the sintered body can be directly used with the state of the sintered face. The sintered body according to the present invention is obtained with high density and high thermal conduction through addition of a small amount of sintering assistant. Thus, it is not necessary to remove the sintering assistant during sintering.

Surface roughness of the inventive sintered body, which is in the state of a sintered face, is not more than 5 μm in Rmax. According to the prior art, surface roughness in the state of a sintered face has inevitably exceeded 10 μm in Rmax. Surface roughness of a sintered body to be employed as a circuit board must be about 5 μm. The inventive sintered body having high thermal conductivity can be directly applied to a circuit board in the state of a sintered face.

Preferably a C-axis lattice constant of aluminum nitride particles is at least 4.9800 Å in the present invention. Upon solution treatment with oxygen, the lattice constant of aluminum nitride may be reduced. Thus, it may be considered that purity of aluminum nitride is reduced and an aluminum nitride sintered body having high thermal conductivity cannot be obtained when the lattice constant is not more than 4.9800 Å.

Aluminum nitride ceramics obtained by the present invention is extremely resistant against exposure to beams such as electron beams, cation beams and the like, as well as to sputtering by these beams. Thus, the inventive aluminum nitride sintered body presents excellent performance in employment under exposure to electron beams, plasma or the like. This may be considered because local temperature increase caused by exposure to such beams is small since aluminum nitride has high thermal conductivity, with small selective damage of intergranular phases which are recessive to beam application.

The aluminum nitride sintered body obtained by the present invention has permittivity of not more than 7.6 under a high frequency of 10 GHz. Such low permittivity is particularly important for a substrate for carrying a high-frequency element of a high speed. The inventive sintered body has low permittivity as a whole, since the same contains only a slight amount of intergranular phases having high permittivity.

According to the inventive method of manufacturing an aluminum nitride sintered body, aluminum nitride powder is first prepared. At least one compound containing a rare earth element is added to this aluminum nitride powder, so that mixed powder thus obtained contains 0.01 to 1.0 percent by weight of the rare earth element. Such mixing is performed in an organic solvent by a general method. Mixing in water is not preferable since the aluminum nitride powder is oxidized. The mixed powder thus obtained is formed with a forming assistant of paraffin, polyvinyl butyral (PVB), polyethylene glycol (PEG) or the like. A substance such as phenol resin, which is decomposed to leave carbon, carbon powder, graphite powder or the like may be added to control carbon remaining in a sintered body. The rare earth compound is prepared from stearic acid compound, palmitic acid compound, alkoxide lead nitrate, carbonate, hydroxide or the like. A high molecular compound such as stearic acid compound is preferably employed. It may be considered that such compound enables reduction in content of the rare earth element to facilitate mixing with aluminum nitride powder.

Particularly the stearic acid compound is the most preferable rare earth compound, due to mixability with the aluminum nitride powder, the amount of residual carbon etc., in addition to its action as a forming assistant.

The aluminum nitride powder must be in the form of fine homogeneous particles, the average particle size of which is preferably not more than 1 μm. The amount of oxygen contained in the aluminum nitride powder is preferably not more than 2.0 percent by weight. It is difficult to obtain such aluminum nitride powder by a direct nitriding method, i.e., a method through nitriding of metal aluminum. The aluminum nitride powder is obtained by a reduction nitriding method through reduction nitriding of aluminum oxide. When the aluminum nitride powder is to be obtained by the direct nitriding method, control of reaction, classification of particle size etc. must be sufficiently considered. After the mixed powder is formed, the formed body is sintered in a non-oxidizing atmosphere containing nitrogen at a sintering temperature of 1500° to 2200°C. In order to attain high thermal conductivity, it is preferable to sinter the compact at a temperature of 1800° to 2100° C. for at least five hours, so that the aluminum nitride particles are at least 5 μm in average particle size. After the sintering step, the sintered body is quickly cooled. If the sintered body is slowly cooled, the sintering assistant is precipitated to extremely degrade the sintered face. The sintered body is preferably cooled at a rate of at least 200° C./h to a temperature of 1500° C.

The aluminum nitride sintered body obtained according to the present invention is provided thereon with a conductor circuit through metal paste, to be applied to a circuit board. Or, a ceramics package for a semiconductor device is formed by a substrate of the inventive aluminum nitride sintered body, a semiconductor element carried on the major surface of the substrate and a lead frame joined onto the major surface of the substrate.

Metal paste employed for forming a circuit pattern is prepared by adding a glass component or the like to a metal having a high melting point such as tungsten or molybdenum, or a conductor metal such as copper, gold, silver, silver-palladium or the like. A resistor pattern may be formed by metal paste prepared by adding a glass component or the like to a resistor of $RuO_2$ or the like. A substrate formed by the inventive sintered body, which is excellent in homogeneity and purity, has high adhesion strength with respect to metal paste. Thus, a highly reliable circuit board can be provided. Further, it is also possible to form a thin metal layer of Ti, Au, Ni, TaN or the like on the surface of the inventive aluminum nitride sintered body by ion plating, sputtering or the like, thereby to form a circuit pattern. Such a circuit pattern formed through the inventive sintered body is improved in stability against plating upon formation of the circuit pattern, heating in the atmosphere in firing of paste etc. Also in this point, the inventive aluminum sintered body is superior to a circuit board employing a conventional aluminum nitride sintered body.

In a ceramics package prepared through the inventive sintered body, it is effective to interpose a stress relaxation member such as a copper plate for relaxing thermal stress caused between a lead frame and a substrate of the aluminum nitride sintered body, in order to ensure strength of the lead frame. Alternatively, a heat sink prepared by a copper-tungsten alloy plate or the like may be joined to the aluminum nitride sintered body employed as the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
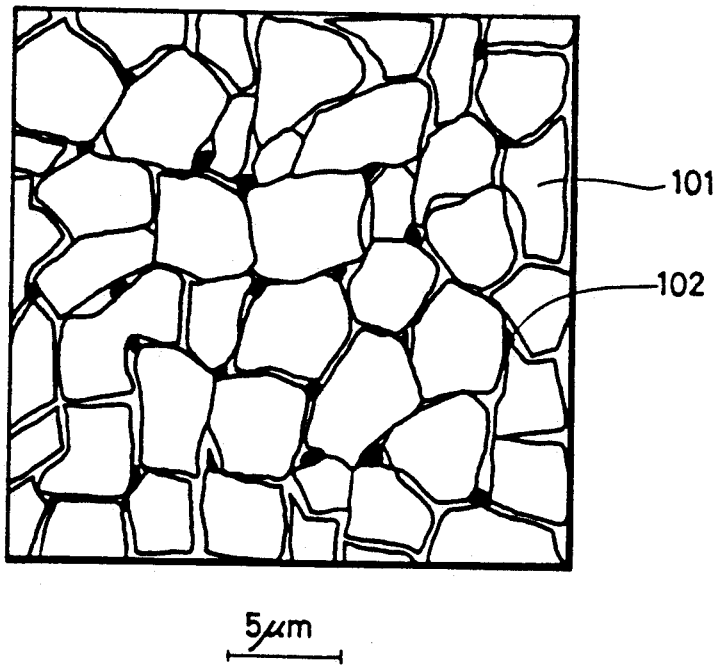
FIG. 1 is a sectional view showing typical crystal structure of an aluminum nitride sintered body according to the present invention.
Figure 2A:
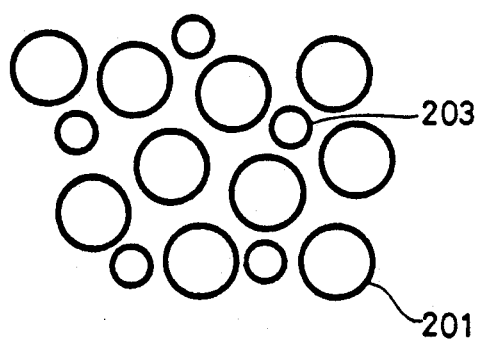
FIG. 2A is a typical diagram showing a mixed state of aluminum nitride particles and sintering assistant particles in a step of manufacturing a conventional aluminum nitride sintered body.
Figure 2B:
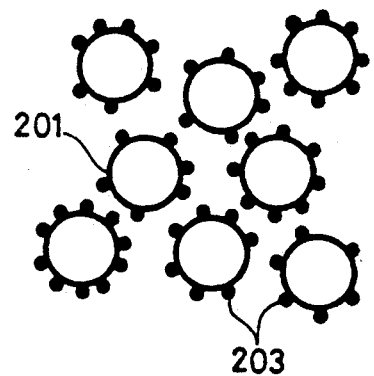
FIG. 2B is a typical diagram showing a mixed state of aluminum nitride particles and sintering assistant particles in a step of manufacturing an aluminum nitride sintered body according to the present invention.

Yttrium stearate in each amount shown in Table 1 and 10 percent by weight of PVB, serving as a forming assistant, were added to aluminum nitride powder having average particle size of 0.4 μm and an oxygen content of 1.4 percent by weight, to be sufficiently mixed with each other in ethanol. Mixed powder thus obtained was formed into a thin plate of 35mm × 35mm × 3mm by a mechanical press. A formed body thus obtained was sintered in a nitrogen air current under conditions shown in Table 1. Table 1 also shows characteristics of each sintered body thus obtained. It is understood that an aluminum nitride sintered body having high thermal conductivity and low permittivity can be obtained with an amount of yttrium (Y) within a range of 0.01 to 1.0 percent by weight and an amount of oxygen not more than 0.5 percent by weight. FIG. 1 is a sectional view showing the structure of a sintered body obtained through the sample No. 4 in Table 1. It is obvious from FIG. 1 that crystals of aluminum nitride particles 101 are uniform. It is also understood that an extremely small amount of intergranular phases 102 are scattered in grain boundaries between the aluminum nitride particles 101. The oxygen content was analyzed through gas analysis after pulverizing each sintered body into particles of about 200 μm in particle size.

TABLE 1

| Sample No. | Amount of Y (wt. %) | Sintering Condition | Characteristics of Sintered Body | | | | | | |
|---|---|---|---|---|---|---|---|---|---|
| | | | Relative Density (%) | Thermal Conductivity (W/mK) | Permittivity (10 MHz) | Permittivity (10 GHz) | Oxygen Content (wt. %) | Y Content (wt. %) | A (Å) |
| *1 | 0 | 1950° C. × 5 h. | 92 | 65 | 8 | 7.3 | 1.0 | 0 | |
| 2 | 0.1 | ↓ | 99 | 190 | 8 | 7.3 | 0.5 | 0.1 | 4.9800 |
| 3 | 0.3 | ↓ | 100 | 220 | 8 | 7.3 | 0.3 | 0.3 | 4.9805 |
| 4 | 0.6 | ↓ | ↓ | 230 | 8 | 7.3 | 0.2 | 0.6 | 4.9815 |
| 5 | 0.9 | ↓ | ↓ | 240 | 8 | 7.3 | 0.1 | 0.9 | 4.9815 |
| *6 | 1.2 | ↓ | ↓ | 240 | 10 | 9.0 | 0.2 | 1.2 | 4.9815 |
| *7 | 3.0 | ↓ | ↓ | 230 | 13 | 12.0 | 1.0 | 3.0 | 4.9817 |
| 8 | 0.5 | 1900° C. × 1 h. | 100 | 190 | 8 | 7.3 | 0.5 | 0.5 | 4.9800 |
| *9 | 0.5 | 1800° C. × 1 h. | 95 | 85 | 8 | 7.3 | 0.9 | 0.5 | 4.9770 |
| 10 | 0.5 | 2100° C. × 3 h. | 100 | 230 | 8 | 7.3 | 0.2 | 0.4 | 4.9815 |
| *11 | 0.5 in $Y_2O_3$ | " | 98 | 110 | 8 | 7.3 | 0.8 | 0.4 | 4.9800 |

*Reference Example

Example 2

Figure 3:
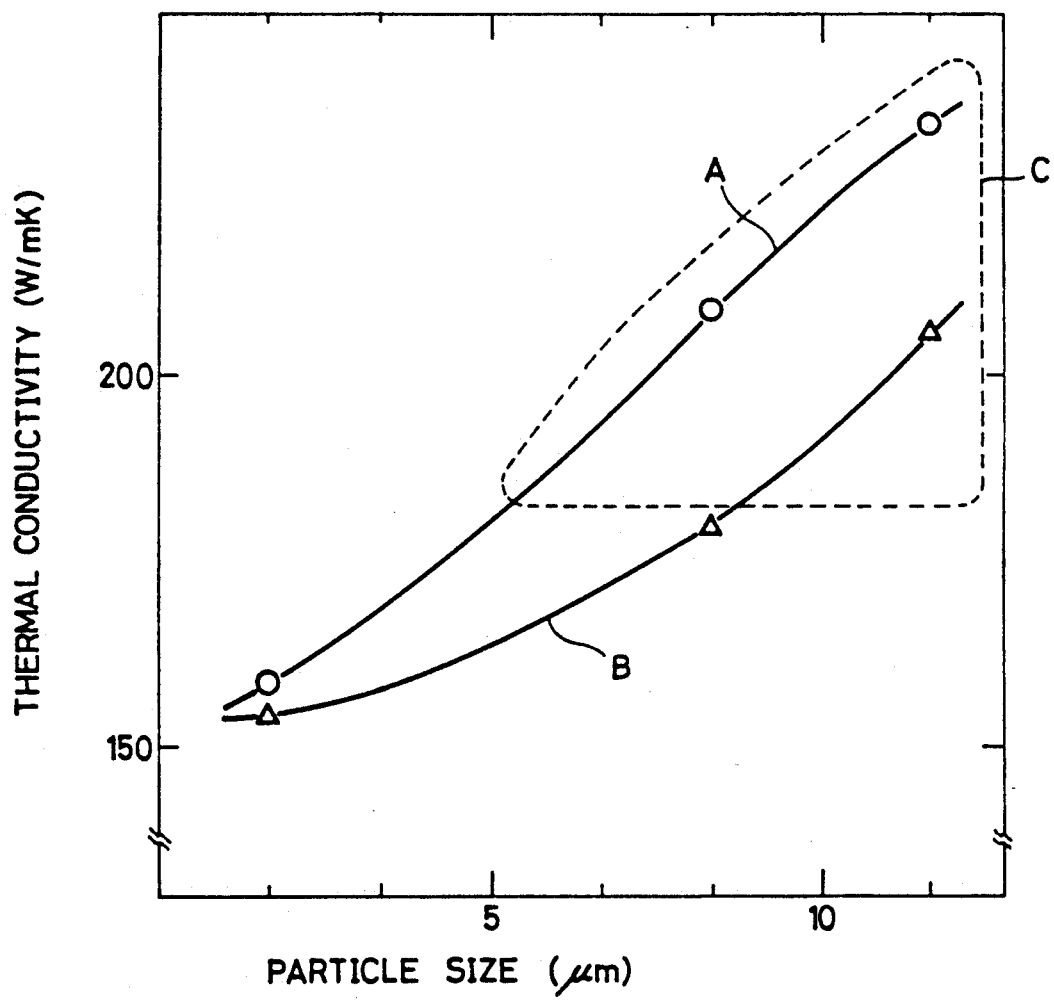
FIG. 3 is a graph showing the result of measurement obtained by Example 2 for proving that the inventive aluminum nitride sintered body has high thermal conductivity.

FIG. 3 shows the result of measurement in an experiment made on the sample No. 4 shown in Table 1 while changing the sintering time. Aluminum nitride particles in a sintered body obtained in the experiment were varied in grain size with the sintering time. As shown in FIG. 3, the first sintered body having thermal conductivity of at least 180 W/mK was obtained when the average particle size of the aluminum nitride particles exceeded 5 μm. In other words, it is important to sufficiently recrystallize aluminum nitride in order to obtain a sintered body having high thermal conductivity. Referring to FIG. 3, each of samples expressed in curves A and B, showing the results of measurement, contained 0.7 percent by weight of carbon after forming and before sintering, while the carbon content was reduced to be below 0.1 percent by weight after sintering.

Example 3

Yttrium stearate in each amount shown in Table 2 and 10 percent by weight of paraffin, serving as a forming assistant, were added to aluminum nitride powder having average particle size of 0.4 μm and an oxygen content of 1.4 percent by weight, and sufficiently mixed with each other in ethanol. Thereafter the mixture was dried and mixed powder thus obtained was formed into a plate of 35mm×35mm×3mm by a mechanical press. A formed body thus obtained was sintered in a nitrogen air current under sintering conditions shown in Table 2. Contents of oxygen, carbon and yttrium (Y) in a sintered body thus obtained were analyzed, followed by measurement of thermal conductivity. As the result, it has been understood that a sintered body having particularly high thermal conductivity can be obtained when the amount of residual carbon in the sintered body is not more than 0.1 percent by weight and the ratio of the content of carbon to that of a rare earth element is within a range of 1/100 to 1/10.

Example 5

Mixed powder obtained by adding 1.5 percent by weight of CaO powder to aluminum nitride powder having average particle size of 0.4 μm and an oxygen content of 1.4 percent by weight was press-formed, to obtain a formed body of 35mm×35mm×1.0mm. This formed body was sintered in an air current at a temperature of 2000° C. for 10 hours, to obtain a sintered body having relative density of 100%, thermal conductivity of 210 W/mK, permittivity of 8 to 10 MHz and 7.3 at 10 GHz, an oxygen content of 0.2 percent by weight and a Ca content of 0.1 percent by weight. A sintered body thus obtained had an extremely irregular sintered face, with surface roughness of 10 μmin Rmax. Thus, it was impossible to employ this sintered body as a material for a substrate in such a state of the sintered face.

In place of the CaO powder, yttrium stearate of 1.5 percent by weight (0.15 percent by weight in yttrium element conversion) was added to obtain mixed powder, which was sintered to prepare a sintered body according to the inventive sintering method. Surface roughness of a sintered face of the sintered body was 4 μm in Rmax, to be employable as a material for a substrate in the state of the sintered face.

Example 6

Sintered bodies of the samples Nos. 10 and 11 in Table 1 were exposed to ion beams under conditions of ion generation voltage of 8 KV, ion generation current of 0.5 mA, an angle of incidence of 30° and sputtering time of 150 minutes. As the result, the sintered body of the sample No. 10 was sputtered only by 2 μm in depth,

TABLE 2

| Sample No. | Amount of Y (wt. %) | Sintering Condition | Characteristics of Sintered Body | | | | |
|---|---|---|---|---|---|---|---|
| | | | Carbon (wt. %) | Y (wt. %) | Oxygen (wt. %) | Thermal Conductivity (W/mK) | Relative Density (%) |
| 21 | 0.2 | 1950° C. × 5H in AlN Case | 0.01 | 0.2 | 0.4 | 200 | 99 |
| 22 | 0.2 | 1950° C. × 2H in C Case | 0.04 | 0.2 | 0.3 | 220 | 99 |
| *23 | 0.1 | 1950° C. × 5H in C Case | 0.15 | 0.1 | 0.1 | 140 | 95 |
| 24 | 0.8 | 1950° C. × 10H in AlN Case | 0.04 | 0.8 | 0.3 | 240 | 99 |
| 25 | 0.8 | 2050° C. × 5H in AlN Case | 0.08 | 0.3 | 0.05 | 260 | 99 |
| 26 | 0.2 | 1900° C. × 3H in AlN Case | 0.005 | 0.2 | 0.2 | 180 | 100 |

*Reference Example

Reference Example

A formed body of the sample No. 7 in Table 1 was sintered in a carbon case at a temperature of 1950° C. for 72 hours, to obtain an aluminum nitride sintered body having relative density of 100%, thermal conductivity of 240 W/mK, permittivity of 8 at 10 MHz and 7.3 at 10 GHz, an oxygen content of 0.1 percent by weight and a yttrium content of 0.6 percent by weight. However, segregation of YN was recognized on the sintered face, to prove that this sintered body cannot be directly employed as a material for a substrate in the state of the sintered face.

On the other hand, no segregation of YN or another second phase was recognized but aluminum nitride particles were homogeneously present in a sintered body according to the present invention.

while the sintered body of the sample No. 11 was sputtered by 11 μm in depth. Thus, it is understood that the inventive aluminum nitride sintered body is excellent in resistance against sputtering.

Example 7

Each sintering assistant shown in Table 3 and 5 percent by weight of acrylic resin, serving as a forming assistant, were added to aluminum nitride powder having average particle size of 0.5 μm and an oxygen content of 1.0 percent by weight, to be sufficiently mixed with each other. Mixed powder thus obtained was formed to be 35 mm ×35mm×3.0mm in size. This formed body was sintered in a nitrogen current at a temperature of 1950° C. for five hours. Table 3 shows characteristics of each sintered body thus obtained. It is understood that the inventive sintered body has high thermal conductivity.

TABLE 3

| No. | Sintering Assistant Compound | (wt. %) | Characteristics of Sintered Body | | | | |
|---|---|---|---|---|---|---|---|
| | | | Relative Density (%) | Thermal Conductivity (W/mK) | Permittivity (10 MHz) | Permittivity (10 GHz) | Surface Roughness (μ) |
| 31 | Ce-stearate | 0.5 | 100 | 210 | 8 | 7.3 | 4 |
| 32 | Gd-stearate | 0.5 | 100 | 210 | 8 | 7.3 | 4 |
| 33 | Pr-stearate | 0.5 | 100 | 210 | 8 | 7.3 | 4 |
| 34 | Y-stearate | 0.3 | 100 | 220 | 8 | 7.3 | 4 |
| | Ce-stearate | 0.3 | 100 | 220 | 8 | 7.3 | 4 |
| 35 | Y-alkoxide | 0.5 | 100 | 200 | 8 | 7.3 | 4 |

Example 8

Commercially available silver paste, gold paste, silver-palladium paste or the like was screen-printed on the surface of an aluminum nitride sintered body obtained through the sample No. 4 shown in Table 1, to be fired in the atmosphere at a temperature of 850° to 950° C. A conductor pattern formed on the surface of a sintered body thus obtained had adhesion strength of at least 1 Kg/mm$^2$, Thus, it is understood that the inventive aluminum nitride sintered body can be employed as a circuit board.

Figure 4:
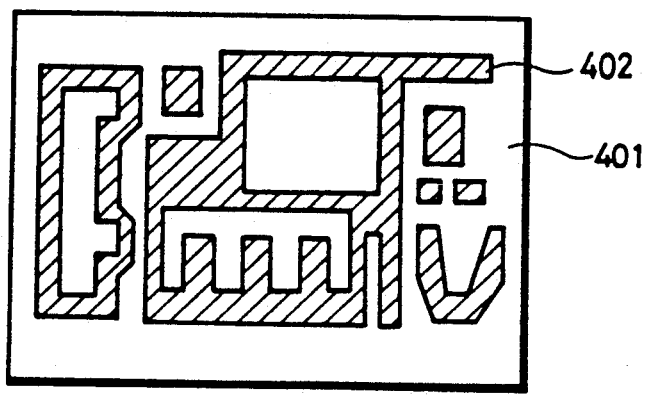
FIG. 4 is a plan view showing a circuit board obtained through the inventive aluminum nitride sintered body.

FIG. 4 is a plan view showing a circuit board formed in the aforementioned manner. Referring to FIG. 4, a conductor pattern 402 of metal paste is formed on the surface of an aluminum sintered body substrate 401.

Example 9

Similarly to Example 8, paste mainly composed of tungsten or molybdenum was screen-printed on an aluminum nitride sintered body, which was then fired in a nitrogen air current at a temperature of 1500° C. Thereafter nickel plating was performed to be brazed with a plate of Kovar, whereby any metallized layer having a high melting point presented high adhesion strength of about 5 Kg/mm$^2$.

Figure 5A:
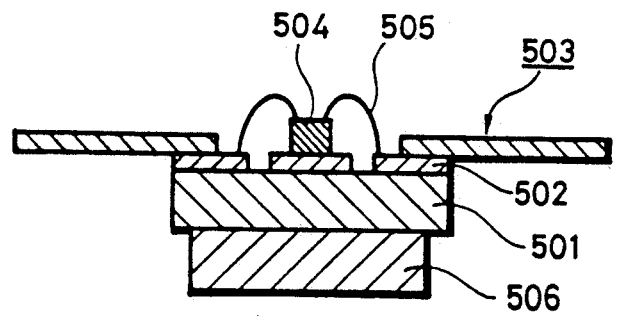
FIGS. 5A and 5B are sectional views showing junction structure of the inventive aluminum nitride sintered body which is employed as a package for a semiconductor device.
Figure 5B:
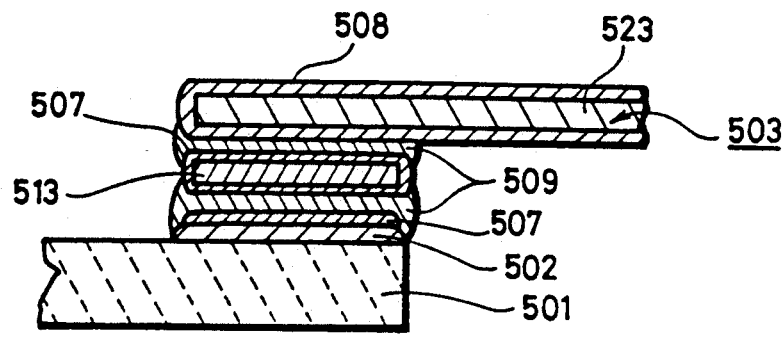

FIGS. 5A and 5B are sectional views showing ceramics packages for semiconductor devices, to which the above Example is applied. Referring to each of these figures, a metallized layer 502 is formed partially on the surface of a substrate 501 of an aluminum nitride sintered body, and a lead frame 503 of a Kovar plate is brazed by a brazing metal or the like to the metallized layer 502, to be joined with the same. Preferably a cushioning member 513 of a copper plate, for example, provided with a nickel-plated layer on its surface is interposed between the metallized layer 502 and the lead frame 503, as shown in FIG. 5B. A semiconductor element 504 such as an FET of high calorific power is carried on a prescribed position of the substrate 501 of the aluminum nitride sintered body, to be connected with the metallized layer 502 or the lead frame 503 by a bonding wire 505.

Further, preferably a heat sink 506 of tungsten alloy such as copper-tungsten alloy, for example, is mounted on the surface of the substrate 501 of the aluminum nitride sintered body. As shown in FIG. 5B, a thin plating layer 507 is formed on the metallized layer 502 in the junction between the aluminum nitride sintered body substrate 501 and the lead frame 503, while the lead frame 503 is formed by a metal layer 523 of Kovar or the like and a plating layer 508 provided on the outer peripheral surface thereof at need, in order to stabilize the wetting property of a metal brazing material 509. "Kovar" is a trade name for Fe-29wt.%Ni-17wt.%Co alloy.

Example 10

Figure 6:
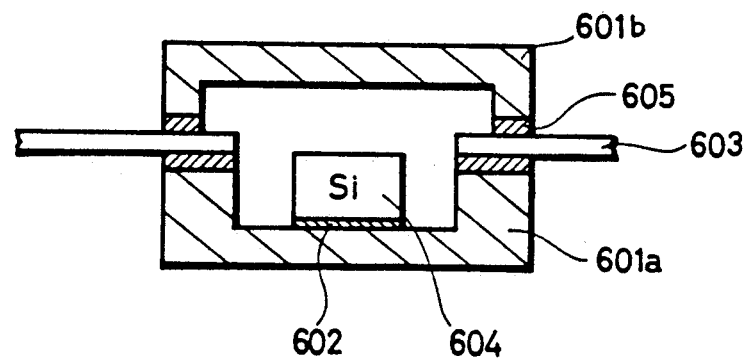
FIG. 6 is a sectional view showing a package for a semiconductor device obtained through Example 10.

An aluminum nitride ceramic substrate of 15mm square having thickness of 0.9mm was obtained through a manufacturing method similar to that for the sample No. 10 in Table 1. As shown in FIG. 6, such an aluminum nitride ceramic substrate 601a had a cavity in its center. A gold-metallized layer 602 was formed in the cavity, and a silicon semiconductor element 604 was joined thereon by die bonding. A PbO, B$_2$O$_3$ seal glass member 605 containing composition β-spodumene was filled in the peripheral edge portion of the aluminum nitride ceramic substrate 601a. A lead frame 603 of 42 alloy (Fe-42wt.% alloy) was provided on the seal glass member 605. A cap 601b of aluminum nitride, the peripheral edge portion of which was filled with a seal glass member 605 similarly to the aluminum nitride ceramic substrate 601a, was fixed onto the lead frame 605. A ceramic package for a semiconductor device thus obtained presented thermal resistance of 20° C/W.

Thus, it was possible to suppress temperature increase of a semiconductor element carried in the package with no specific heat release mechanism.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit board, comprising a substrate made of an aluminum nitride sintered body, a circuit pattern on at least a major surface of said substrate, said circuit pattern including a conductive paste, said aluminum nitride sintered body comprising 0.01 to 0.8 wt% of a rare earth element, 0.2 to 0.5 wt% of oxygen, 0.001 to 0.1 wt% of carbon, the remainder being aluminum nitride consisting essentially of aluminum nitride particles and intergranular phases existing between said aluminum nitride particles, said intergranular phases having a size not more than one micron, and wherein the intergranular phases contain at least two elements selected from the group consisting of rare earth elements, aluminum, oxygen, nitrogen and carbon, said substrate having a surface roughness of not more than 5 microns.

2. The circuit board of claim 1, wherein said conductive paste contains at least one metal selected from the group consisting of silver, gold, palladium, and copper.

3. The circuit board of claim 1, wherein said conductive paste contains a metal selected from the group consisting of tungsten and molybdenum.

4. A semiconductor device, comprising a substrate made of an aluminum nitride sintered body comprising 0.01 to 0.8 wt% of a rare earth element, 0.2 to 0.5 wt% of oxygen, 0.001 to 0.1 wt% of carbon, the remainder being aluminum nitride consisting essentially of aluminum nitride particles and intergranular phases existing between said aluminum nitride particles, said intergranular phases having a size not more than one micron, and wherein the intergranular phases contain at least two elements selected from the group consisting of rare earth elements, aluminum, oxygen, nitrogen and carbon, said substrate having a surface roughness of not more than 5 microns, a semiconductor element carried on a major surface of said substrate, and a lead frame joined to said major surface of said substrate.

5. The semiconductor device of claim 4, further comprising heat sink means joined to said substrate for removing heat from said semiconductor device.

6. The semiconductor device of claim 4, further comprising a stress relaxation member joining said lead frame to said substrate.

* * * * *